(12) United States Patent
Tham et al.

(10) Patent No.: US 10,636,633 B2
(45) Date of Patent: Apr. 28, 2020

(54) SPUTTERING TARGET AND PROCESS FOR PRODUCTION THEREOF

(71) Applicants: TANAKA KIKINZOKU KOGYO K.K., Chiyoda-ku, Tokyo (JP); TOHOKU UNIVERSITY, Sendai, Miyagi (JP)

(72) Inventors: Kim Kong Tham, Tsukuba (JP); Toshiya Yamamoto, Tsukuba (JP); Shin Saito, Sendai (JP); Shintaro Hinata, Sendai (JP); Migaku Takahashi, Sendai (JP)

(73) Assignees: TANAKA KIKINZOKU KOGYO K.K., Tokyo (JP); TOHOKU UNIVERSITY, Miyagi (JP)

( * ) Notice: Subject to any disclaimer, the term of this patent is extended or adjusted under 35 U.S.C. 154(b) by 540 days.

(21) Appl. No.: 15/304,938

(22) PCT Filed: Apr. 14, 2015

(86) PCT No.: PCT/JP2015/061409
§ 371 (c)(1),
(2) Date: Oct. 18, 2016

(87) PCT Pub. No.: WO2015/166795
PCT Pub. Date: Nov. 5, 2015

(65) Prior Publication Data
US 2017/0194131 A1 Jul. 6, 2017

(30) Foreign Application Priority Data
May 2, 2014 (JP) .................... 2014-095566

(51) Int. Cl.
C23C 14/34 (2006.01)
H01J 37/34 (2006.01)
(Continued)

(52) U.S. Cl.
CPC .......... *H01J 37/3429* (2013.01); *C04B 35/00* (2013.01); *C22C 1/0466* (2013.01);
(Continued)

(58) Field of Classification Search
CPC .................................................. H01J 37/3426
See application file for complete search history.

(56) References Cited

U.S. PATENT DOCUMENTS 6,406,600 B1    6/2002  Takashima
2006/0246323 A1* 11/2006 Liu .................... G11B 5/65
                                                         428/829
(Continued)

FOREIGN PATENT DOCUMENTS

JP    2000-282229 A    10/2000
JP    2010-257565 A    11/2010
WO    WO 2010/074171 A1   7/2010

OTHER PUBLICATIONS

JP, Notification of Reasons for Refusal for JP application No. 2014-095566, dated Jun. 18, 2018.
(Continued)

*Primary Examiner* — Jason Berman
(74) *Attorney, Agent, or Firm* — Orrick, Herrington & Sutcliffe LLP; Joseph A. Calvaruso; K. Patrick Herman (57) ABSTRACT

Provided is a sputtering target with which it is possible to form a magnetic thin film having a high coercive force Hc and a process for production thereof. The sputtering target is a sputtering target comprising metallic Co, metallic Pt, and an oxide, wherein the sputtering target does not contain metallic Cr, and the oxide is $WO_3$ and wherein the sputtering target comprises 25 to 50 at % of metallic Co relative to a total of metallic Co and metallic Pt.

20 Claims, 7 Drawing Sheets

(51) Int. Cl.
- *C22C 5/04* (2006.01)
- *C22C 19/07* (2006.01)
- *C22C 1/05* (2006.01)
- *C04B 35/00* (2006.01)
- *C22F 1/14* (2006.01)
- *C22F 1/10* (2006.01)
- *C23C 14/58* (2006.01)
- *C23C 14/06* (2006.01)
- *C22C 1/10* (2006.01)
- *C22C 1/04* (2006.01)
- *C23C 14/14* (2006.01)
- *C23C 14/08* (2006.01)
- *B22F 3/14* (2006.01)
- *B22F 9/04* (2006.01)
- *B22F 9/08* (2006.01)

(52) U.S. Cl.
CPC .............. *C22C 1/05* (2013.01); *C22C 1/1084* (2013.01); *C22C 5/04* (2013.01); *C22C 19/07* (2013.01); *C22F 1/10* (2013.01); *C22F 1/14* (2013.01); *C23C 14/0688* (2013.01); *C23C 14/083* (2013.01); *C23C 14/14* (2013.01); *C23C 14/3414* (2013.01); *C23C 14/5806* (2013.01); *H01J 37/3426* (2013.01); *B22F 3/14* (2013.01); *B22F 9/04* (2013.01); *B22F 9/082* (2013.01); *B22F 2301/15* (2013.01); *B22F 2301/25* (2013.01); *B22F 2302/25* (2013.01); *B22F 2998/10* (2013.01); *B22F 2999/00* (2013.01)

(56) References Cited

U.S. PATENT DOCUMENTS

2010/0247963 A1 9/2010 Kim et al.
2011/0253926 A1 10/2011 Hayashi

OTHER PUBLICATIONS

WO, International Preliminary Report on Patentability concerning international application No. PCT/JP2015/061409, dated Nov. 3, 2016.
PCT, International Search Report for PCT/JP2015/061409, dated Jun. 30, 2015.
Hashimoto, Nano-structure and Magnetic Property of CoPt-$TiO_2$ Perpendicular Magnetic Recording Film, IEICE Technical Report, Jul. 3, 2008, vol. 108, No. 124, p. 27-31.
Nolan, Microstructure and Exchange Coupling of Segregated Oxide Perpendicular Recording Media, IEEE Transactions on Magnetics, Feb. 2007, vol. 43, No. 2, p. 639-644.
Ariake, Improvement of Magnetic and R/W Performance by Annealing on CoPt-$TiO_2$ Granular Films for Perpendicular Magnetic Recording Media, IEICE Technical Report, Nov. 14, 2008, p. 31-36.
Oikawa et al., Microstructure and Magnetic Properties of CoPt-$TiO_2$ Perpendicular Recording Media, IEEE Transactions on Magnetics, Sep. 2002 vol. 38, No. 5, p. 1976-1978.
Piramanayagam, Perpendicular recording media for hard disk drives, Journal of Applied Physics, 102, 011301-1 to 011301-22.
Hinata et al., Structure control of CoPt-$TiO_2$ granular film deposited by heat process (I)—Recrystallization of Ru underlayer and growth regime of granular magnetic layer, the $37^{th}$ annual conference on magnetics in Japan, Sep. 2013, 5a A-1.
Tham et al., Coercivity enhancement of CoPt-$WO_3$ granular film with post annealing, IEEE International Magnetics Conference, Desden, Germany, May 4-8, 2014, Published on the internet on Feb. 3, 2014.

* cited by examiner

SPUTTERING TARGET AND PROCESS FOR PRODUCTION THEREOF

TECHNICAL FIELD

The present invention relates to a sputtering target and a process for production thereof. More particularly, the present invention relates to a sputtering target with which it is possible to form a magnetic thin film having a high coercive force and to a process for production thereof. Hereinafter, the sputtering target may be referred to simply as a "target".

BACKGROUND ART

A magnetic disk in a hard disk drive utilizes a magnetic thin film having a CoPtCr-oxide-based granular structure as a magnetic recording film that records information signals (for example, see Non-Patent Literature 1). In order to further improve the recording density of this magnetic thin film, there is a need to micronize magnetic crystal grains contained in the magnetic recording layer (magnetic thin film).

However, the progress of micronization of magnetic crystal grains has resulted in occurrence of the so-called thermal fluctuation phenomenon, in which the superparamagnetic phenomenon impairs the thermal stability of recorded signals and leads to loss of the recorded signals. This thermal fluctuation phenomenon has contributed a major obstacle to increasing the recording density of magnetic disks.

In order to surmount this obstacle, the magnetic energy of each magnetic crystal grain needs to be increased such that the magnetic energy exceeds the thermal energy. The magnetic energy of each magnetic crystal grain is obtained by $v \times K_u$, which is a product of the volume v of the magnetic crystal grain and the magnetocrystalline anisotropy constant $K_u$. Therefore, the magnetocrystalline anisotropy constant $K_u$ of the magnetic crystal grain needs to be increased in order to increase the magnetic energy (for example, see Non-Patent Literature 2).

Current perpendicular magnetic recording films have a granular structure composed of columnar CoPtCr crystal grains and crystal grain boundaries formed of an oxide that surrounds the columnar CoPtCr crystal grains. In order to increase the magnetocrystalline anisotropy constant $K_u$ of the CoPtCr-oxide film having this granular structure, an attempt to perform sputtering with the substrate temperature elevated has been made. Sputtering with the substrate temperature elevated is intended to promote diffusion of metal atoms (Co atom, Pt atom, Cr atom) during film deposition and thus to obtain favorable magnetic crystal grains.

However, when the CoPtCr-oxide film is formed by performing sputtering with the substrate temperature elevated, the CoPtCr magnetic crystal grains grow not in a columnar shape but in spherical shape, which generates a phenomenon in which the magnetic crystal grains have a low magnetic anisotropy and the obtained CoPtCr-oxide film has a reduced magnetocrystalline anisotropy constant $K_u$ (see Non-Patent Literature 3).

Therefore, the inventors of the present invention have attempted to improve the magnetocrystalline anisotropy constant $K_u$ by performing annealing after forming a CoPtCr-oxide film (at room temperature) without raising the temperature of the substrate. However, annealing has increased the diameter of the lower portions (portions near the substrate) of columnar CoPtCr magnetic crystal grains and has caused magnetic coupling in the lower portions of the CoPtCr magnetic crystal grains. This has increased the interaction between the grains and has undesirably reduced the coercive force Hc.

CITATION LIST

Non-Patent Literature

Non-Patent Literature 1: T. Oikawa et al., IEEE TRANSACTIONS ON MAGNETICS, September 2002, VOL. 38, NO. 5, p. 1976-1978
Non-Patent Literature 2: S. N. Piramanayagam, JOURNAL OF APPLIED PHYSICS, 2007, 102, 011301
Non-Patent Literature 3: Shintaro Hinata and four others, the 37th annual conference on magnetics in Japan, September 2013, 5aA-1

SUMMARY OF INVENTION

Technical Problem

In light of such circumstances, a first object of the present invention is to provide a sputtering target with which it is possible to form a magnetic thin film having a high coercive force Hc and to provide a process for production thereof.

A second object of the present invention is to provide a sputtering target with which it is possible to form a magnetic thin film whose coercive force Hc can be increased by annealing and to provide a process for production thereof.

Solution to Problem

The inventors of the present invention have diligently carried out studies to solve the above-mentioned problem. As a result, the inventors of the present invention have found that the magnetocrystalline anisotropy constant $K_u$ can be improved by forming magnetic crystal grains in a magnetic thin film (perpendicular magnetic recording film) having a granular structure by using a CoPt alloy using no Cr instead of using a CoPtCr alloy, which is used in current magnetic thin films (perpendicular magnetic recording films).

Furthermore, the inventors of the present invention have found that an oxide used when a CoPt-oxide film is formed by using magnetic crystal grains made of a CoPt alloy is preferably $WO_3$ and $TiO_2$ and particularly preferably $WO_3$ in order to obtain a high coercive force Hc of the film deposited at room temperature and to further increase the coercive force Hc by annealing the film deposited at room temperature.

The present invention has been made on the basis of these new findings.

Namely, a sputtering target according to the present invention is a sputtering target comprising metallic Co, metallic Pt, and an oxide, wherein the sputtering target does not contain metallic Cr, and the oxide has at least one of $WO_3$ and $TiO_2$.

In the above-described sputtering target, it is preferable that the sputtering target comprises 20 to 90 at % of metallic Co relative to a total of metallic Co and metallic Pt.

It is preferable that the oxide is at least one of $WO_3$ and $TiO_2$.

It is preferable that the oxide has $WO_3$.

It is preferable that the oxide is $WO_3$.

It is preferable that the sputtering target comprises 10 to 50 vol % of the oxide, and it is more preferable that the sputtering target comprises 25 to 35 vol % of the oxide.

It is preferable that the sputtering target can be used for forming a magnetic thin film.

Preferably, the magnetic thin film formed by using the sputtering target is allowed to have a coercive force of 6 kOe or higher, which is equal to or higher than the coercive force realized at the current technical level (hereinafter may be referred to as the "current technical level of coercive force"), by annealing the magnetic thin film in the temperature range of 300° C. or higher and 550° C. or lower.

More preferably, the oxide has $WO_3$ and the magnetic thin film formed by using the sputtering target is allowed to have a coercive force of 9 kOe or higher, which is over the current technical level of coercive force, by annealing the magnetic thin film in the temperature range of 400° C. or higher and 520° C. or lower.

Further preferably, the oxide has $WO_3$ and the magnetic thin film formed by using the sputtering target is allowed to have a coercive force of 10 kOe or higher, which is over the current technical level of coercive force, by annealing the magnetic thin film in the temperature range of 460° C. or higher and 520° C. or lower.

It is preferable that the magnetic thin film after the annealing has a granular structure.

A first aspect of a process for production of a sputtering target according to the present invention is a process for production of a sputtering target, comprising: a step of preparing a CoPt alloy powder that contains Co and Pt and does not contain Cr by an atomizing method; a step of preparing a powder mixture for pressure sintering by dispersedly mixing an oxide powder and the prepared CoPt alloy powder; and a step of pressure-sintering the prepared powder mixture for pressure sintering, wherein the oxide powder has at least one of $WO_3$ and $TiO_2$.

A second aspect of a process for production of a sputtering target according to the present invention is a process for production of a sputtering target, comprising: a step of obtaining a powder mixture for pressure sintering by dispersedly mixing a Co powder, a Pt powder, and an oxide powder; and a step of pressure-sintering the obtained powder mixture for pressure sintering, wherein the oxide powder has at least one of $WO_3$ and $TiO_2$.

It is preferable that the sputtering target obtained by the above-described process for production of a sputtering target contains 20 to 90 at % of metallic Co relative to a total of the metallic Co and metallic Pt.

It is preferable that the oxide powder is at least one of $WO_3$ and $TiO_2$.

It is preferable that the oxide powder has $WO_3$.

It is preferable that the oxide powder is $WO_3$.

A volume fraction of the oxide powder in the entire powder mixture for pressure sintering is preferably 10 to 50 vol %, and is more preferably 25 to 35 vol %.

Advantageous Effects of Invention

The present invention can provide a sputtering target with which it is possible to form a magnetic thin film having a high coercive force Hc and provide a process for production thereof.

Also, the present invention can provide a sputtering target with which it is possible to form a magnetic thin film whose coercive force Hc can be increased by annealing and provide a process for production thereof.

BRIEF DESCRIPTION OF DRAWINGS

FIG. 7(a) illustrates a plane TEM micrograph of the CoPt—$WO_3$ magnetic thin film without annealing, FIG. 7(b) illustrates a plane TEM micrograph of the CoPt—$WO_3$ magnetic thin film with annealing at 500° C., and FIG. 7(c) illustrates a cross-sectional TEM micrograph of the CoPt—$WO_3$ magnetic thin film with annealing at 500° C.

DESCRIPTION OF EMBODIMENTS

A sputtering target according to an embodiment of the present invention is a sputtering target comprising metallic Co, metallic Pt, and an oxide, wherein the sputtering target does not contain metallic Cr, and the oxide has at least one of $WO_3$ and $TiO_2$.

1. Components of Target

The sputtering target according to this embodiment contains Co and Pt as metallic components and may further contain other metals (for example, Au, Ag, Ru, Rh, Pd, Ir, W, Ta, Cu, B, and Mo) unless these metals interfere with formation of the magnetic thin film. As demonstrated in Reference Instance described below, the sputtering target cannot contain metallic Cr because the presence of metallic Cr has an adverse effect on the magnetocrystalline anisotropy constant $K_u$ of the magnetic thin film.

Metallic Co and metallic Pt are components of magnetic crystal grains (fine magnet) in the granular structure of the magnetic thin film formed by sputtering.

Co is a ferromagnetic metal element and plays a central role in the formation of the magnetic crystal grains (fine magnet) in the granular structure of the magnetic thin film. In order to increase the magnetocrystalline anisotropy constant of the CoPt alloy particles (magnetic crystal grains) in the magnetic thin film obtained by sputtering and to maintain the magnetism of the CoPt alloy particles in the obtained magnetic thin film, the content percentage of metallic Co in the sputtering target according to this embodiment is preferably 20 to 90 at % and more preferably 25 to 85 at % relative to the total metallic components (the total of metallic Co and metallic Pt).

Platinum, when alloying with Co in a predetermined composition range, has the function of reducing the magnetic moment of the alloy and thus has a role of adjusting the magnetic strength of the magnetic crystal grains. In order to increase the magnetocrystalline anisotropy constant of the CoPt alloy particles (magnetic crystal grains) in the magnetic thin film obtained by sputtering and to adjust the magnetism of the CoPt alloy particles (magnetic crystal grains) in the obtained magnetic thin film, the content percentage of metallic Pt in the sputtering target according to this embodiment is preferably 10 to 80 at % and more preferably 15 to 75 at % relative to the total metallic components.

The sputtering target according to this embodiment contains at least one of $WO_3$ and $TiO_2$ as an oxide component. The oxide component serves as a non-magnetic matrix that separates the magnetic crystal grains (fine magnet) from each other in the granular structure of the magnetic thin film.

The sputtering target according to this embodiment contains at least one of $WO_3$ and $TiO_2$ as an oxide and may further contain other oxides (for example, $SiO_2$, $Ti_2O_3$, $Ta_2O_5$, $Cr_2O_3$, CoO, $Co_3O_4$, $B_2O_3$, $Fe_2O_3$, CuO, $Y_2O_3$, MgO, $Al_2O_3$, $ZrO_2$, $Nb_2O_5$, $MoO_3$, $CeO_2$, $Sm_2O_3$, $Gd_2O_3$, $WO_2$, $HfO_2$, and $NiO_2$) unless these oxides interfere with formation of the magnetic thin film. As demonstrated in Examples described below, $WO_3$ or $TiO_2$ is preferably used as an oxide because the use of $WO_3$ or $TiO_2$ as an oxide can increase the coercive force Hc of the magnetic thin film deposited at room temperature and allows further improvement in the coercive force Hc by annealing the magnetic thin film deposited at room temperature. As demonstrated in Examples described below, $WO_3$ is particularly preferably used as an oxide because the use of $WO_3$ as an oxide can significantly increase the coercive force Hc of the magnetic thin film formed.

The content percentage of metallic components and the content percentage of oxide components in the entire sputtering target depend on the composition of a desired magnetic thin film. Although not limited, the content percentage of metallic components in the entire sputtering target may be, for example, 88 to 94 mol %, and the content percentage of oxide components in the entire sputtering target may be, for example, 6 to 12 mol %.

As described above, the oxide component serves as a non-magnetic matrix that separates the magnetic crystal grains (fine magnet) from each other in the granular structure of the magnetic thin film. Thus, a large oxide content in the magnetic thin film is preferred because it is easy to assuredly separate the magnetic crystal grains from each other and to make the magnetic crystal grains independent from each other. The oxide content in the sputtering target according to this embodiment is preferably 10 vol % or larger, and more preferably 20 vol % or larger, and still more preferably 25 vol % or larger.

However, an excessively large oxide content in the magnetic thin film has an adverse effect on the crystallinity of the CoPt alloy particles (magnetic crystal grains) because the CoPt alloy particles (magnetic crystal grains) are contaminated with the oxide, which may increase the proportion of structures other than the hcp structure in the CoPt alloy particles (magnetic crystal grains). This also reduces the number of the magnetic crystal grains per unit area of the magnetic thin film and thus makes it difficult to increase the recording density. In light of such views, the oxide content in the sputtering target according to this embodiment is preferably 50 vol % or less, more preferably 40 vol % or less, and still more preferably 35 vol % or less.

Therefore, the oxide content in the sputtering target according to this embodiment relative to the entire sputtering target is preferably 10 to 50 vol %, more preferably 20 to 40 vol %, and still more preferably 25 to 35 vol %.

2. Microstructure of Sputtering Target

The microstructure of the sputtering target according to this embodiment is not particularly limited, but is preferably a microstructure in which a metal phase and an oxide phase are finely dispersed in each other. Such a microstructure makes it difficult to generate defects such as nodules and particles during sputtering.

3. Process for Production of Spattering Target

The sputtering target according to this embodiment can be produced, for example, in the following manner. An example production process in which $WO_3$ is used as an oxide will be described here.

(1) Preparation of CoPt Alloy-Atomized Powder

Metallic Co and metallic Pt are weighed so as to obtain a prescribed composition (the atomic ratio of metallic Co to the total of the metallic Co and metallic Pt is 20 to 90 at %), and a molten CoPt alloy is produced. Subsequently, the molten CoPt alloy is gas-atomized to prepare a CoPt alloy-atomized powder having a prescribed composition (the atomic ratio of metallic Co to the total of the metallic Co and metallic Pt is preferably 20 to 90 at %). The produced CoPt alloy-atomized powder is classified so that the particle size becomes not larger than a predetermined particle size (for example, 106 μm or smaller).

In order to increase the magnetism of the CoPt alloy-atomized powder, the atomic ratio of metallic Co to the total of the metallic Co and metallic Pt contained in the power is preferably 25 at % or larger and more preferably 30 at % or larger.

(2) Preparation of Powder Mixture for Pressure Sintering

A $WO_3$ powder is added to the CoPt alloy-atomized powder prepared in (1). The mixture is dispersedly mixed with a ball mill to prepare a powder mixture for pressure sintering. By dispersedly mixing the CoPt alloy-atomized powder and the $WO_3$ powder with the ball mill, a powder mixture for pressure sintering in which the CoPt alloy-atomized powder and the $WO_3$ powder are finely dispersed in each other can be prepared.

In the magnetic thin film formed by using the obtained sputtering target, the volume fraction of the $WO_3$ powder in the entire powder mixture for pressure sintering is preferably 10 to 50 vol %, more preferably 15 to 40 vol %, and still more preferably 25 to 35 vol % in order to easily make the magnetic crystal grains independent from each other by assuredly separating the magnetic crystal grains from each other by $WO_3$, to makes it easy for the CoPt alloy particles (magnetic crystal grains) to have the hcp structure, and to increase the recording density.

(3) Molding

The powder mixture for pressure sintering prepared in (2) is pressure-sintered and molded using, for example, a vacuum hot pressing method to produce a target. Since the powder mixture for pressure sintering prepared in (2) has been dispersedly mixed with a ball mill and the CoPt alloy-atomized powder and the $WO_3$ powder are finely dispersed in each other, defects such as generation of nodules and particles are unlikely to occur during sputtering using the spattering target obtained by this production process.

The method for pressure-sintering the powder mixture for pressure sintering is not limited. The method may be a method other than a vacuum hot pressing method and may be, for example, a HIP method.

(4) Modification

The example production process described in (1) to (3) involves preparing the CoPt alloy-atomized powder by an atomizing method, adding the $WO_3$ powder to the prepared CoPt alloy-atomized powder, and dispersedly mixing the mixture with the ball mill to prepare the powder mixture for pressure sintering. A Co single powder and a Pt single powder may be used instead of using the CoPt alloy-atomized powder. In such a case, three types of powder, which are a Co single powder, a Pt single powder, and a $WO_3$ powder, are dispersedly mixed with a ball mil to prepare a powder mixture for pressure sintering.

EXAMPLES

Hereinafter, the data that support the absence of metallic Cr in the sputtering target according to the present invention are first shown in Reference Instance. Specifically, there are shown the experimental results indicating that the magnetocrystalline anisotropy constant $K_u$ is improved by forming magnetic crystal grains in a magnetic thin film having a granular structure by using a CoPt alloy that does not contain Cr instead of using a CoPtCr alloy, which is used in current perpendicular magnetic recording films. On the basis of the experimental results shown in Reference Instance, the sputtering target used for forming the magnetic thin film is free of metallic Cr in the present invention.

In Examples and Comparative Examples, studies were carried out using four types of oxides, provided that the sputtering target used for forming the magnetic thin film was free of metallic Cr (the magnetic crystal grains in the magnetic thin film were formed of a CoPt alloy that does not contain Cr). The sputtering target that realized the magnetic thin film having a coercive force Hc over 10 kOe was obtained by selecting $WO_3$ as an oxide. The coercive force Hc of a magnetic thin film realized at the current technical level is about 6 to 7 kOe, and no magnetic thin film having a coercive force Hc over 10 kOe has been reported at present as long as the inventors of the present invention know.

(Reference Instance)

A magnetic recording film was formed by sputtering with a DC sputtering apparatus. The magnetic recording film was formed on a glass substrate. The stacked structure of the formed magnetic recording film includes, in order of increasing distance from the glass substrate, Ta (5 nm, 0.6 Pa)/Pt (6 nm, 0.6 Pa)/Ru (10 nm, 0.6 Pa)/Ru (10 nm, 8 Pa)/$Co_{60}Cr_{40}$-26 vol. % $SiO_2$ (2 nm, 4 Pa)/CoPt based alloy-$SiO_2$ (16 nm, 4 Pa)/C (7 nm, 0.6 Pa). The number on the left side in parenthesis indicates the film thickness, and the number on the right side indicates the pressure of an Ar atmosphere during sputtering.

In the stacked structure of the formed magnetic recording film, CoPt based alloy-$SiO_2$ is a magnetic thin film that serves as the recording layer of a perpendicular magnetic recording medium. In Reference Instance, the following samples were prepared: a sample in which magnetic crystal grains in the magnetic thin film made of CoPt based alloy-$SiO_2$ were formed of a CoPtCr alloy that contained Cr (a sample in which the magnetic thin film had a composition of $Co_{74}Pt_{16}Cr_{10}$-25 vol. % $SiO_2$); and a sample in which magnetic crystal grains in the magnetic thin film made of CoPt based alloy-$SiO_2$ were formed of a CoPt alloy that did not contain Cr (a sample in which the magnetic thin film had a composition of $Co_{82.4}Pt_{17.6}$-27.7 vol. % $SiO_2$). Therefore, the term "CoPt based alloy" in the "CoPt based alloy-$SiO_2$" in the stacked structure of the magnetic recording film in Reference Instance refers to both a ternary CoPtCr alloy that contains Cr and a binary CoPt alloy that does not contain Cr. Hereinafter, the term "CoPt based alloy" also refers to both a ternary CoPtCr alloy that contains Cr and a binary CoPt alloy that does not contain Cr.

In addition, samples were prepared by forming the magnetic thin film made of CoPt based alloy-$SiO_2$ at different substrate temperatures during film deposition. Specifically, the following samples were prepared: a sample in which the magnetic thin film made of CoPt based alloy-$SiO_2$ was deposited on a substrate that was not heated but maintained at room temperature; and a sample in which the magnetic thin film made of CoPt based alloy-$SiO_2$ was deposited on a substrate that had been heated to a predetermined temperature until just before film deposition and had been transferred to a sputtering unit in the apparatus just before the start of film deposition.

Figure 1:
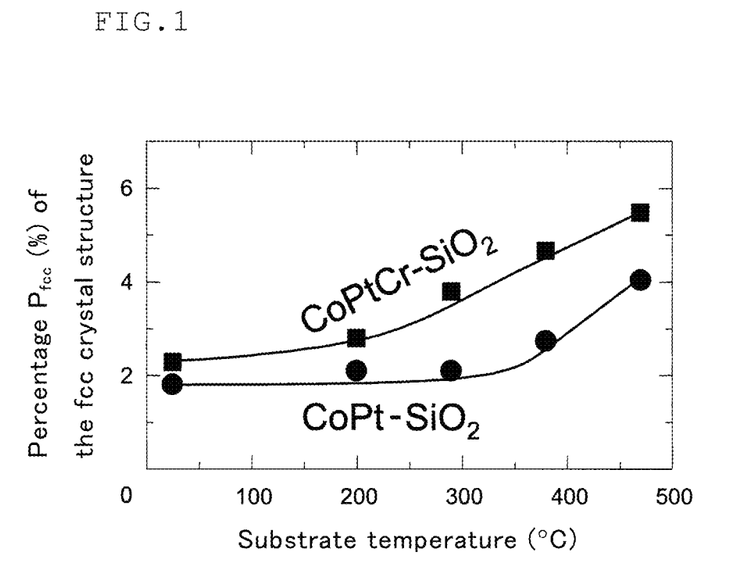
FIG. 1 is a graph showing the percentage $P_{fcc}$ of the fcc crystal structure present in the CoPt based alloy particles (magnetic crystal grains).

The prepared samples were analyzed for their crystal structures by in-plain X-ray diffraction. The analysis reveals that the crystal structure of the CoPt based alloy particles (magnetic crystal grains) in the CoPt based alloy-$SiO_2$ magnetic thin film formed in Reference Instance was composed mostly of the hcp structure and the remaining small part was composed of the fcc structure in all samples. FIG. 1 is a graph showing the results of the crystal structure analysis by in-plain X-ray diffraction. The graph shows the percentage $P_{fcc}$ of the fcc crystal structure present in the CoPt based alloy particles (magnetic crystal grains). The horizontal axis of the graph shown in FIG. 1 represents the substrate temperature (° C.) just before film deposition. The vertical axis of the graph shown in FIG. 1 represents the percentage $P_{fcc}$ (%) of the fcc crystal structure present in the CoPt based alloy particles (magnetic crystal grains).

As shown in FIG. 1, in CoPtCr—$SiO_2$, which was a magnetic thin film that contained Cr, $P_{fcc}$ was substantially constant at about 2.5% until the substrate temperature reached 200° C. The percentage $P_{fcc}$ increased monotonously with increasing substrate temperature when the substrate temperature was in the temperature range of 200° C. to 470° C. The percentage $P_{fcc}$ was about 5.5% when the substrate temperature was 470° C. In CoPt—$SiO_2$, which was a magnetic thin film that did not contain Cr, $P_{fcc}$ was substantially constant at less than about 2% until the substrate temperature reached about 300° C. The percentage $P_{fcc}$ started to increase with increasing substrate temperature when the substrate temperature exceeded about 300° C. But, the percentage $P_{fcc}$ was about 4.0% even when the substrate temperature was 470° C.

Therefore, it is found that the absence of Cr in the CoPt based alloy-$SiO_2$ magnetic thin film leads to a low percentage $P_{fcc}$ of the fcc crystal structure present in the CoPt based alloy particles (magnetic crystal grains) and thus to a low percentage of stacking faults.

Figure 2:
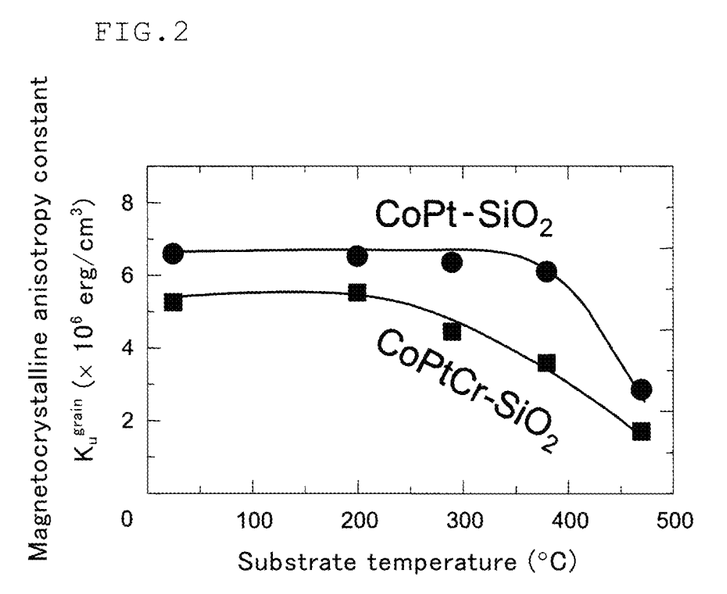
FIG. 2 is a graph showing the measured results of the magnetocrystalline anisotropy constant $K_u$ of a CoPt based alloy-$SiO_2$ magnetic thin film.

The magnetocrystalline anisotropy constant $K_u$ was determined by using a torque magnetometer for the prepared samples. FIG. 2 is a graph showing the results of determination of the magnetocrystalline anisotropy constant $K_u$ by using the torque magnetometer. The horizontal axis of the graph shown in FIG. 2 represents the substrate temperature (° C.) just before film deposition. The vertical axis of the graph shown in FIG. 2 represents the magnetocrystalline anisotropy constant $K_u$ ($\times 10^6$ erg/cm$^3$).

As shown in FIG. 2, in CoPtCr—$SiO_2$, which was a magnetic thin film that contained Cr, the magnetocrystalline anisotropy constant $K_u$ was substantially constant at about $5.4 \times 10^6$ erg/cm$^3$ until the substrate temperature reached 200° C. The magnetocrystalline anisotropy constant $K_u$ decreased monotonously with increasing substrate temperature when the substrate temperature was in the temperature range of 200° C. to 470° C. The magnetocrystalline anisotropy constant $K_u$ was about 1.7 erg/cm$^3$ when the substrate temperature was 470° C. In CoPt—$SiO_2$, which was a magnetic thin film that did not contain Cr, the magnetocrystalline anisotropy constant $K_u$ was substantially constant at about 6.5 erg/cm$^3$ until the substrate temperature reached about 300° C. The magnetocrystalline anisotropy constant $K_u$ started to decrease with increasing substrate temperature when the substrate temperature exceeded about 300° C. But, the magnetocrystalline anisotropy constant $K_u$ was about 2.5 erg/cm$^3$ even when the substrate temperature was 470° C.

Therefore, it is found that the absence of Cr in the CoPt based alloy-SiO$_2$ magnetic thin film leads to a large magnetocrystalline anisotropy constant $K_u$ of the magnetic thin film. This is probably because the formation of the CoPt—SiO$_2$ magnetic thin film that does not contain Cr by eliminating Cr from the CoPtCr—SiO$_2$ magnetic thin film that contains Cr results in a low percentage $P_{fcc}$ of the fcc crystal structure present in the CoPt based alloy particles (magnetic crystal grains) and thus in a small amount of stacking faults.

Example 1

The composition of the entire target prepared as Example 1 is 91.4 (80Co-20Pt)-8.6WO$_3$ in terms of molar ratio. The target was prepared and evaluated in the following manner. The composition of the entire target prepared in Example 1, when the content percentage of the oxide (WO$_3$) is expressed as the volume fraction in the entire target, is (80Co-20Pt)-30 vol % WO$_3$. The target prepared in Example 1 is within the scope of the target according to the present invention.

To prepare the target according to Example 1, an 80Co-20Pt alloy-atomized powder was prepared first. Specifically, metals were weighed so as to obtain an alloy composition of Co: 80 at % and Pt: 20 at % and heated to 1500° C. or higher to prepare a molten alloy. The molten alloy was gas-atomized to prepare an 80Co-20Pt alloy-atomized powder.

The prepared 80Co-20Pt alloy-atomized powder was separately classified through 150 mesh sieves to obtain 80Co-20Pt alloy-atomized powder having a particle diameter of 106 μm or smaller.

To 610.00 g of the classified 80Co-20Pt alloy-atomized powder, 154.44 g of a WO$_3$ powder was added. Then, the mixture was mixed and dispersed by a ball mill to obtain a powder mixture for pressure sintering. The cumulative rotation number of a ball mill was 1,870,560.

The obtained powder mixture (30 g) for pressure sintering was subjected to hot pressing under the conditions of sintering temperature: 900° C., pressure: 26 MPa, time: 30 min, and atmosphere: 5×10$^{-2}$ Pa or lower to prepare a sintered test piece (φ 30 mm). The relative density of the prepared sintered test piece was 101.641%. The calculated density is 10.64 g/cm$^3$.

Figure 3:
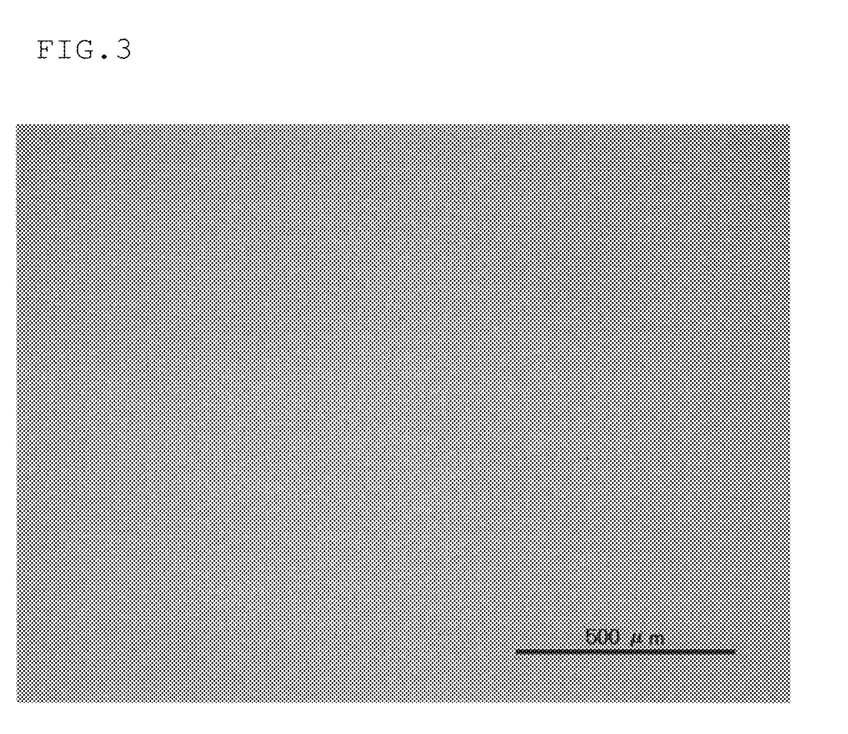
FIG. 3 is a metallurgical microscope photograph of the cross section in the thickness direction of a sintered test piece according to Example 1 (an image taken at a magnification of 100×; a bar scale in the photograph represents 500 μm).
Figure 4:
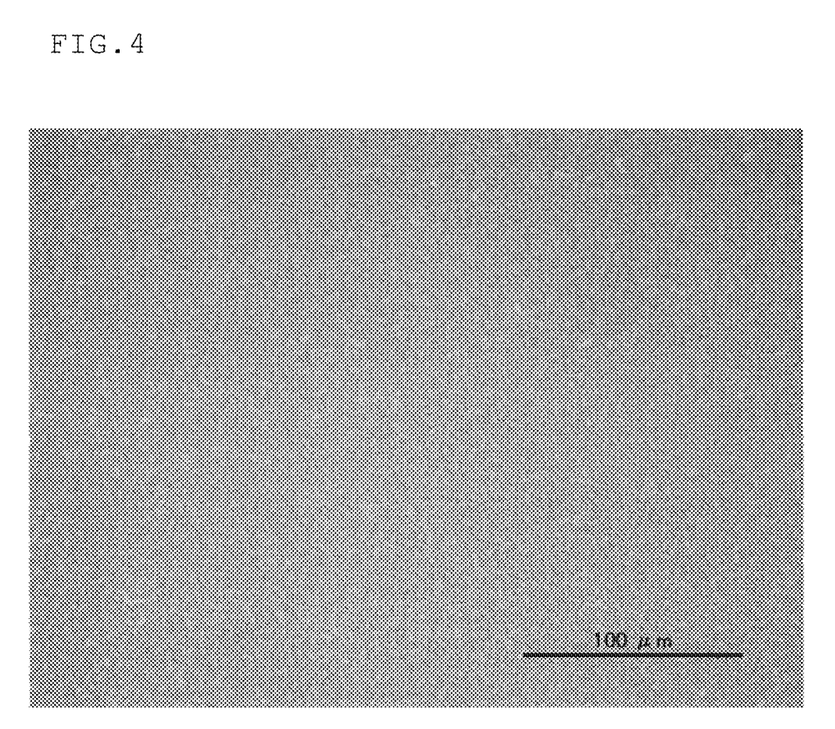
FIG. 4 is a metallurgical microscope photograph of the cross section in the thickness direction of a sintered test piece according to Example 1 (an image taken at a magnification of 500×; a bar scale in the photograph represents 100 μm).

FIG. 3 and FIG. 4 are metallurgical microscope photograph of the cross section in the thickness direction of the obtained sintered test piece. FIG. 3 is a photograph at a photographing magnification of 100 times (a bar scale in the photograph represents 500 μm), and FIG. 4 is a photograph at a photographing magnification of 500 times (a bar scale in the photograph represents 100 μm).

As can be seen from FIG. 3 and FIG. 4, the 80Co-20Pt-alloy phase and the WO$_3$ phase were finely dispersed in and mixed with each other.

Next, the prepared powder mixture for pressure sintering was subjected to hot pressing under the conditions of sintering temperature: 900° C., pressure: 26 MPa, time: 60 min, and atmosphere: 5×10$^{-2}$ Pa or lower to prepare a target with φ164.0 mm and a thickness of 2.0 mm. The relative density of the prepared target was 99.7%.

The prepared target was evaluated for leakage flux on the basis of ASTM F2086-01. As a result, the average magnetic leakage flux rate was 59.3%. This average magnetic leakage flux rate is sufficient for favorable magnetron sputtering.

Next, a magnetic thin film made of (80Co-20Pt)-30 vol % WO$_3$ was deposited on a substrate by magnetron sputtering using the prepared target to produce a sample for determining magnetic properties. The stacked structure of this sample for determining magnetic properties includes glass/Ta (5 nm, 0.6 Pa)/Pt (6 nm, 0.6 Pa)/Ru (10 nm, 0.6 Pa)/Ru (10 nm, 8 Pa)/Co$_{60}$Cr$_{40}$-26 vol. % SiO$_2$ (2 nm, 4 Pa)/CoPt alloy-WO$_3$ (16 nm, 8 Pa). The number on the left side in parenthesis indicates the film thickness, and the number on the right side indicates the pressure of an Ar atmosphere during sputtering.

In the stacked structure of the sample for determining magnetic properties, CoPt alloy-WO$_3$ is a magnetic thin film deposited by using the target prepared in Example 1. This magnetic thin film was deposited at room temperature without heating the substrate during film deposition.

Next, the obtained sample for determining magnetic properties was annealed in an annealing furnace (degree of vacuum: 5×10$^{-4}$ or less). The heating rate and cooling rate of the annealing furnace were both constant at 200° C./h. The annealing temperatures were 200° C., 300° C., 400° C., 450° C., 500° C., and 600° C. Different samples for determining magnetic properties were used at different annealing temperatures. There was one annealed sample for determining magnetic properties at each annealing temperature in Example 1, that is, there were total six samples. In the annealing, each sample was maintained at an annealing temperature for 0 hours and cooled to room temperature. That is, heating was terminated when a predetermined annealing temperature was reached, and the sample was cooled to room temperature.

The M-H loops (magnetization curves) were obtained by using a magneto-optical Kerr effect apparatus for the samples (total six samples) for determining magnetic properties that had been annealed by heating to a target annealing temperature and cooled to room temperature and the sample (one sample) for determining magnetic properties that had not been annealed after film deposition at room temperature. The coercive force Hc was read from each M-H loop (magnetization curve).

Figure 5:
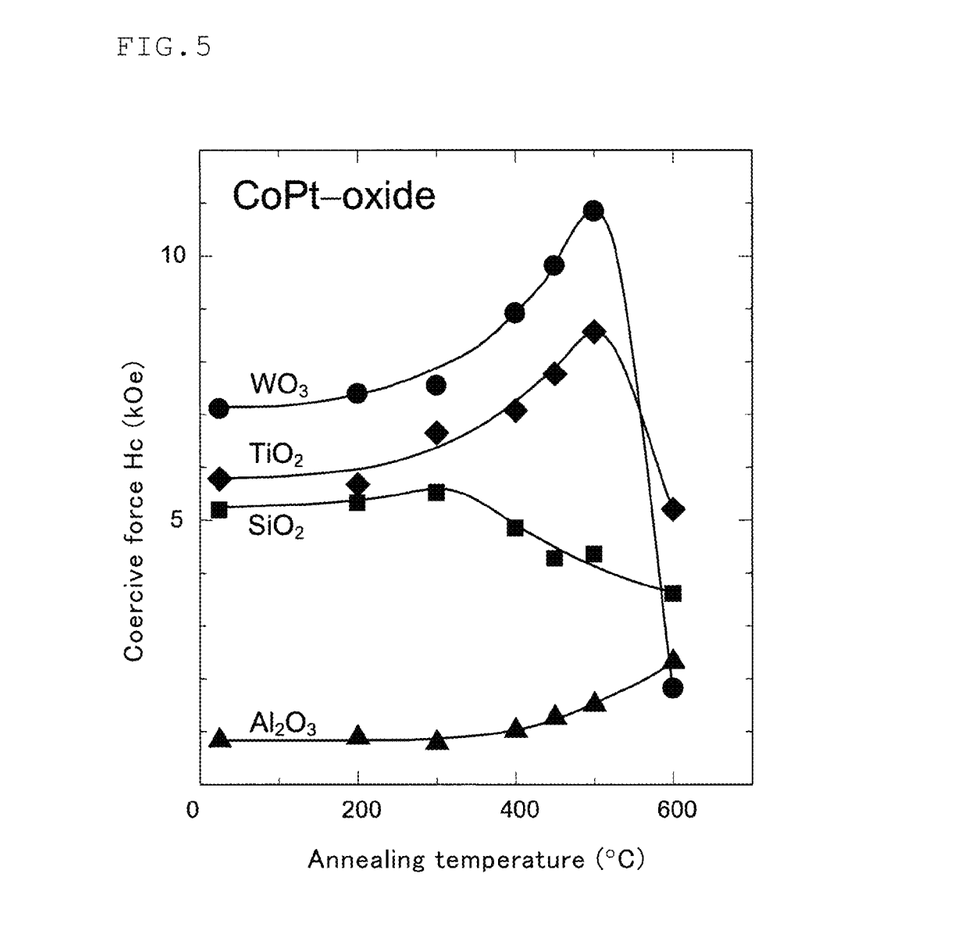
FIG. 5 is a graph showing the measured results of the coercive force Hc of magnetic thin films (CoPt alloy-oxide).

The measured results of the coercive force Hc are shown in FIG. 5 together with the results in other Examples and Comparative Examples. The horizontal axis of FIG. 5 represents the annealing temperature (° C.), and the vertical axis represents the coercive force Hc (kOe).

In Example 1, the coercive force Hc of the sample without annealing was 7.1 kOe. This coercive force is equal to or higher than the coercive force of a magnetic thin film realized at the current technical level. The magnetic thin film of Example 1, even without annealing, has a coercive force sufficient for use as a current perpendicular magnetic recording medium.

In Example 1, the coercive force Hc was further increased by annealing. As can be seen from FIG. 5, the coercive force Hc reached the maximum when the annealing temperature was 500° C. The maximum coercive force Hc was 10.8 kOe, which was over 10 kOe. As described above, the coercive force Hc of a magnetic thin film realized at the current technical level is about 6 to 7 kOe, and no magnetic thin film having a coercive force Hc over 10 kOe has been reported as long as the inventors of the present invention know. The magnetic thin film of Example 1 (annealed at 500° C.) is the first magnetic thin film having a coercive force Hc over 10 kOe.

Figure 6:
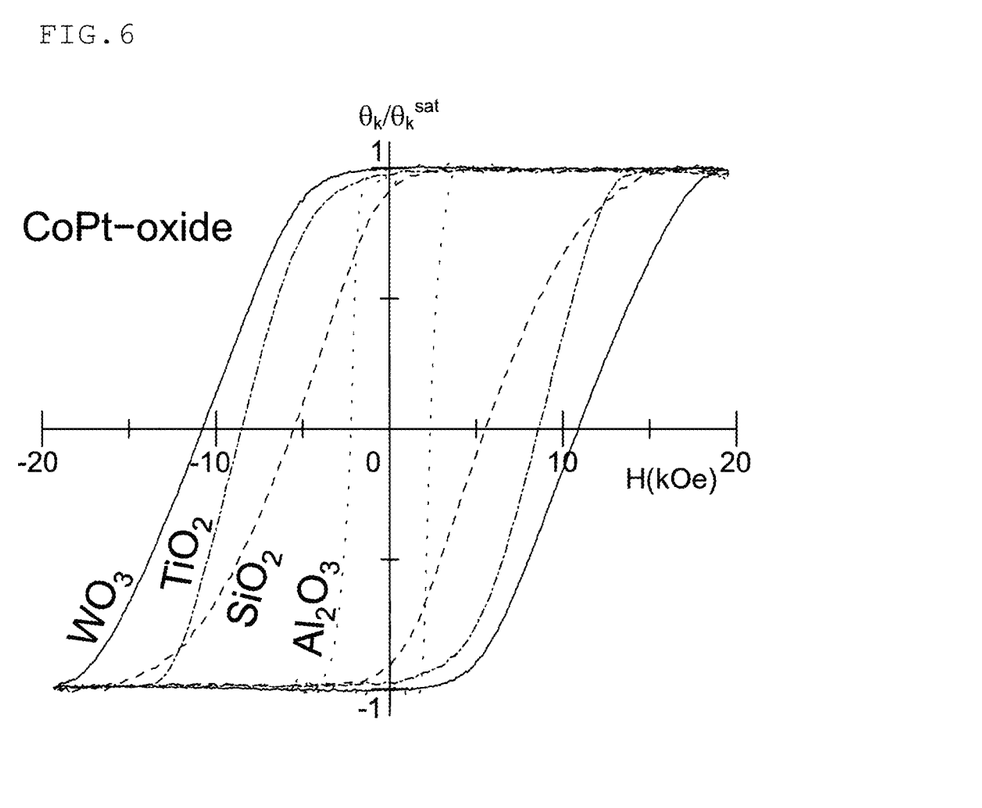
FIG. 6 is a graph showing the M-H loops (magnetization curves) of the magnetic thin films (CoPt alloy-oxide).

The M-H loop (magnetization curve) when the maximum coercive force Hc was obtained (when the annealing temperature was 500° C.) is shown in FIG. 6 together with the results of other Examples and Comparative Examples. The horizontal axis of FIG. 6 represents the strength of the magnetic field applied. The vertical axis of FIG. 6 represents the value normalized by dividing the rotation angle (Kerr rotation angle) of the polarization axis of incident light by the saturation Kerr rotation angle.

Example 2

The composition of the entire target prepared as Example 2 is (80Co-20Pt)-30 vol % $TiO_2$. A target was prepared in the same manner as in Example 1 except that $TiO_2$ was used as an oxide. The target prepared in Example 2 is within the scope of the target according to the present invention. Samples for determining magnetic properties were also prepared in the same manner as in Example 1 using the prepared target.

In the same manner as in Example 1, the M-H loops (magnetization curves) were obtained by using a magneto-optical Kerr effect apparatus for samples (total six samples) for determining magnetic properties that had been annealed at target annealing temperatures (200° C., 300° C., 400° C., 450° C., 500° C., and 600° C.) and cooled to room temperature and a sample (one sample) for determining magnetic properties that had not been annealed after film deposition at room temperature. The coercive force Hc was read from each M-H loop (magnetization curve).

The measured results of the coercive force Hc are shown in FIG. 5 together with the results in other Examples and Comparative Examples.

In Example 2, the coercive force Hc of the sample without annealing was 5.8 kOe. The coercive force Hc of the samples with annealing reached the maximum when the annealing temperature was 500° C. The maximum coercive force Hc was 8.6 kOe. As described above, the coercive force Hc of a magnetic thin film realized at the current technical level is about 6 to 7 kOe. The coercive force Hc of the magnetic thin film of Example 2 (annealed at 500° C.) exceeds the coercive force Hc of a magnetic thin film realized at the current technical level.

The M-H loop (magnetization curve) when the maximum coercive force Hc was obtained (when the annealing temperature was 500° C.) is shown in FIG. 6 together with the results of other Examples and Comparative Examples.

Comparative Example 1

The composition of the entire target prepared as Comparative Example 1 is (80Co-20Pt)-30 vol % $SiO_2$. A target was prepared in the same manner as in Example 1 except that $SiO_2$ was used as an oxide. Since the oxide used in the target prepared in Comparative Example 1 is $SiO_2$, the target prepared in Comparative Example 1 is out of the scope of the target according to the present invention. Samples for determining magnetic properties were also prepared in the same manner as in Example 1 using the prepared target.

In the same manner as in Example 1, the M-H loops (magnetization curves) were obtained by using a magneto-optical Kerr effect apparatus for samples (total six samples) for determining magnetic properties that had been annealed at target annealing temperatures (200° C., 300° C., 400° C., 450° C., 500° C., and 600° C.) and cooled to room temperature and a sample (one sample) for determining magnetic properties that had not been annealed after film deposition at room temperature. The coercive force Hc was read from each M-H loop (magnetization curve).

The measured results of the coercive force Hc are shown in FIG. 5 together with the results in other Examples and Comparative Examples.

In Comparative Example 1, the coercive force Hc of the sample without annealing was 5.2 kOe. The coercive force Hc of the samples with annealing reached the maximum when the annealing temperature was 300° C. The maximum coercive force Hc was 5.5 kOe.

The M-H loop (magnetization curve) when the maximum coercive force Hc was obtained (when the annealing temperature was 300° C.) is shown in FIG. 6 together with the results of other Examples and Comparative Examples.

Comparative Example 2

The composition of the entire target prepared as Comparative Example 2 is (80Co-20Pt)-30 vol % $Al_2O_3$. A target was prepared in the same manner as in Example 1 except that $Al_2O_3$ was used as an oxide. Since the oxide used in the target prepared in Comparative Example 2 is $Al_2O_3$, the target prepared in Comparative Example 2 is out of the scope of the target according to the present invention. Samples for determining magnetic properties were also prepared in the same manner as in Example 1 using the prepared target.

In the same manner as in Example 1, the M-H loops (magnetization curves) were obtained by using a magneto-optical Kerr effect apparatus for samples (total six samples) for determining magnetic properties that had been annealed at target annealing temperatures (200° C., 300° C., 400° C., 450° C., 500° C., and 600° C.) and cooled to room temperature and a sample (one sample) for determining magnetic properties that had not been annealed after film deposition at room temperature. The coercive force Hc was read from each M-H loop (magnetization curve).

The measured results of the coercive force Hc are shown in FIG. 5 together with the results in other Examples and Comparative Examples.

In Comparative Example 2, the coercive force Hc of the sample without annealing was 0.9 kOe. The coercive force Hc of the samples with annealing reached the maximum when the annealing temperature was 600° C. The maximum coercive force Hc was 2.3 kOe.

The M-H loop (magnetization curve) when the maximum coercive force Hc was obtained (when the annealing temperature was 600° C.) is shown in FIG. 6 together with the results of other Examples and Comparative Examples.

(Studies about Oxide)

The oxide used in Example 1 is $WO_3$, the oxide used in Example 2 is $TiO_2$, the oxide used in Comparative Example 1 is $SiO_2$, and the oxide used in Comparative Example 2 is $Al_2O_3$.

In order to further study how these four types of oxides affect the magnetic properties of the obtained magnetic thin film, the nucleation magnetic field Hn (kOe) and the slope $\alpha$ of the M-H loops (magnetization curves) were calculated from the M-H loops shown in FIG. 6 (the M-H loops for the samples for determining magnetic properties that had been annealed at the annealing temperature at which the coercive force Hc reached the maximum). The slope $\alpha$ of the M-H loops (magnetization curves) was calculated in accordance with the formula of $4\pi \times |dM/dH|$ using the data in the region near the points indicating the coercive force Hc. The calculated results of the nucleation magnetic field Hn (kOe) and the slope α of the M-H loops are shown in Table 1 below together with the maximum coercive force Hc described above.

TABLE 1

| Oxide | Coercive force Hc (kOe) | Nucleation magnetic field Hn (kOe) | Slope α of the M-H loops |
|---|---|---|---|
| $WO_3$ (Example 1) | 10.8 | 5.5 | 1.6 |
| $TiO_2$ (Example 2) | 8.6 | 4.9 | 2.2 |
| $SiO_2$ (Comparative Example 1) | 5.5 | 0.4 | 1.8 |
| $Al_2O_3$ (Comparative Example 2) | 2.3 | 1.8 | 14.5 |

As can be seen from Table 1, the coercive force Hc and the nucleation magnetic field Hn of the magnetic thin film of Example 1 using $WO_3$ as an oxide are the highest, and 10.8 (kOe) and 5.5 (kOe), respectively. As described above, the coercive force Hc of a magnetic thin film realized at the current technical level is about 6 to 7 kOe, and no magnetic thin film having a coercive force Hc over 10 kOe has been reported as long as the inventors of the present invention know. The magnetic thin film of Example 1 (annealed at 500° C.) is the first magnetic thin film having a coercive force Hc over 10 kOe.

The slope α of the M-H loop of the magnetic thin film of Example 1 (after annealed at 500° C.) using $WO_3$ as an oxide is as small as 1.6, which suggests that a rapid magnetic reversal is unlikely to occur.

Since the coercive force Hc and the nucleation magnetic field Hn are high and the slope α of the M-H loop is small for the magnetic thin film of Example 1 (annealed at 500° C.) using $WO_3$ as an oxide, the thermal stability of record signals when the magnetic thin film of Example 1 is used as a magnetic recording film is considered significantly high.

As can be seen from FIG. 5, the coercive force Hc of the magnetic thin film of Example 1 using $WO_3$ as an oxide increases with increasing annealing temperature when the annealing temperature is in the range of 500° C. or less. Thus, the magnetic thin film of Example 1 is also characterized in that the coercive force Hc is improved by annealing at an annealing temperature of 500° C. or less.

As can be seen from FIG. 5, the coercive force Hc of the magnetic thin film of Example 1 using $WO_3$ as an oxide is 7.1 kOe even when the magnetic thin film is not annealed (in the state as it was deposited at room temperature). This coercive force is equal to or higher than the coercive force of a magnetic thin film realized at the current technical level. Therefore, the magnetic thin film of Example 1, even without annealing, has a coercive force sufficient for use as a current perpendicular magnetic recording medium.

The coercive force Hc and the nucleation magnetic field Hn of the magnetic thin film of Example 2 (annealed at 500° C.) using $TiO_2$ as an oxide are 8.6 (kOe) and 4.9 (kOe), respectively, which are below those of the magnetic thin film of Example 1. However, compared with current magnetic thin films, the magnetic thin film of Example 2 has a coercive force over the realized coercive force. The thermal stability of record signals when the magnetic thin film of Example 2 is used as a magnetic recording film is considered significantly high.

As can be seen from FIG. 5, the coercive force Hc of the magnetic thin film of Example 2 using $TiO_2$ as an oxide increases with increasing annealing temperature when the annealing temperature is in the range of 500° C. or less. Thus, the magnetic thin film of Example 2 is also characterized in that the coercive force Hc is improved by annealing at an annealing temperature of 500° C. or less.

The coercive forces of the magnetic thin film of Comparative Example 1 using $SiO_2$ as an oxide and the magnetic thin film of Comparative Example 2 using $Al_2O_3$ as an oxide, regardless of whether annealing is performed, do not reach the coercive force (6 to 7 kOe) of a magnetic thin film realized at the current technical level. The thermal stability of record signals when the magnetic thin films of Comparative Examples 1 and 2 are used as magnetic recording films cannot be considered high.

(TEM Observation of Magnetic Thin Film of Example 1)

Figure 7:
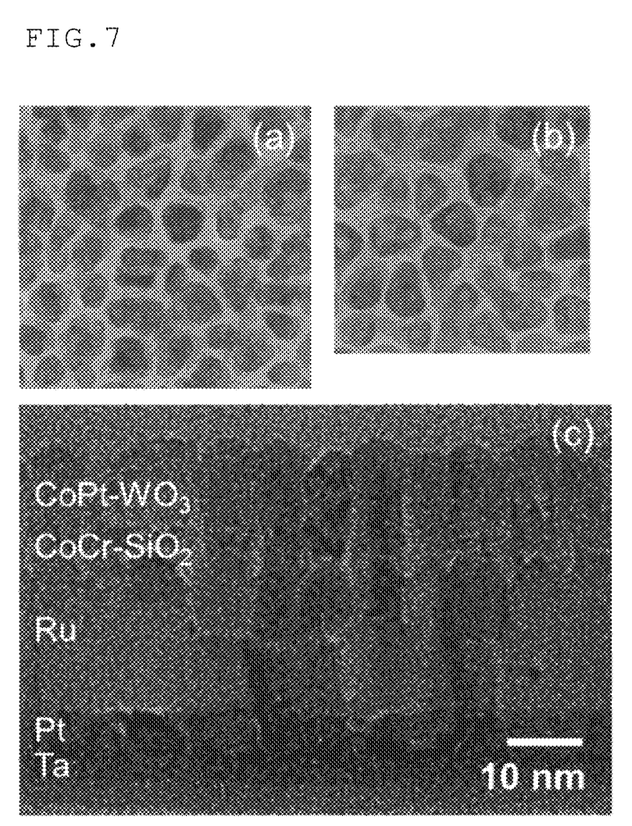
FIG. 7 illustrates TEM micrographs of a magnetic thin film of Example 1, where

The microstructure of the magnetic thin film of Example 1 (magnetic thin film using $WO_3$ as an oxide) that attained very good magnetic properties was examined by using TEM. FIG. 7 illustrates TEM micrographs of the magnetic thin film of Example 1.

FIG. 7(a) illustrates a plane TEM micrograph of the CoPt—$WO_3$ magnetic thin film without annealing (the TEM micrograph of the surface of the magnetic thin film in the plane direction). FIG. 7(b) illustrates a plane TEM micrograph of the CoPt—$WO_3$ magnetic thin film with annealing at 500° C.

In the plane TEM micrographs of FIGS. 7(a) and 7(b), the deep gray regions indicate the CoPt alloy and the white regions indicate $WO_3$. As can be seen from FIGS. 7(a) and 7(b), regardless of whether annealing is performed, the CoPt alloy magnetic crystal grains are separated by $WO_3$ at a distance of about 1 nm to form a favorable granular structure.

The area of the region of each CoPt alloy magnetic crystal grain was determined at 100 points or more by using the plane TEM micrographs. Assuming that the shape of each CoPt alloy magnetic crystal grain is a cylinder, the crystal grain size (diameter of the cylinder) was calculated. As a result, the crystal grain size was 6.4 nm when annealing was not performed and 8 nm when annealing was performed at 500° C. This suggests that annealing causes the CoPt alloy magnetic crystal grains to grow in a cylindrical shape.

FIG. 7(c) illustrates a cross-sectional TEM micrograph of the CoPt—$WO_3$ magnetic thin film with annealing at 500° C. (the TEM micrograph of the cross-section in the direction perpendicular to the plane of the magnetic thin film). As can be seen from this cross-sectional TEM micrograph, the CoPt alloy magnetic crystal grains grow in a cylindrical shape in the CoPt—$WO_3$ magnetic thin film with annealing at 500° C.

As described above, TEM observation reveals that the CoPt—$WO_3$ magnetic thin film has a good granular structure regardless of whether annealing is performed. It is also revealed that annealing the CoPt—$WO_3$ magnetic thin film at 500° C. allows the CoPt alloy magnetic crystal grains to grow in a cylindrical shape.

(Suitable Annealing Temperature)

Since the magnetic thin films of Examples 1 and 2 attain a good coercive force Hc, studies are carried out on the annealing temperature suitable for the magnetic thin films of Examples 1 and 2 on the basis of FIG. 5 (the graph indicating the relationship between the annealing temperature and the coercive force Hc).

As can be seen from FIG. 5, when the annealing temperature is in the temperature range of 300° C. or higher and 550° C. or lower, the coercive forces Hc of the magnetic thin films of Examples 1 and 2 are about 6.5 kOe or higher, which are equal to or higher than the coercive force Hc of a magnetic thin film of the current technical level. Therefore, the annealing temperature for the magnetic thin films of Examples 1 and 2 is preferably in the temperature range of 300° C. or higher and 550° C. or lower.

As can be seen from FIG. 5, when the annealing temperature is in the temperature range of 400° C. or higher and 520° C. or lower, the coercive force Hc of the magnetic thin film of Example 1 is about 9 kOe or higher, which is a coercive force Hc over the current technical level. When the annealing temperature is in the temperature range of 400° C. or higher and 520° C. or lower, the coercive force Hc of the magnetic thin film of Example 2 is about 7.1 kOe or higher, which is a coercive force Hc equal to or higher than the coercive force Hc of a magnetic thin film of the current technical level. Therefore, the annealing temperature for the magnetic thin films of Examples 1 and 2 is more preferably in the temperature range of 400° C. or higher and 520° C. or lower.

As can be seen from FIG. 5, when the annealing temperature is in the temperature range of 460° C. or higher and 520° C. or lower, the coercive force Hc of the magnetic thin film of Example 1 is about 10 kOe or higher, which is a coercive force Hc that a magnetic thin film of the current technical level does not achieve. When the annealing temperature is in the temperature range of 460° C. or higher and 520° C. or lower, the coercive force Hc of the magnetic thin film of Example 2 is about 8 kOe or higher, which is a coercive force Hc over the current technical level. Therefore, the annealing temperature for the magnetic thin films of Examples 1 and 2 is still more preferably in the temperature range of 460° C. or higher and 520° C. or lower.

As can be seen from FIG. 5, when the annealing temperature is in the temperature range of 480° C. or higher and 510° C. or lower, the coercive forces Hc of the magnetic thin films of Examples 1 and 2 reach substantially the maximum. Therefore, the annealing temperature for the magnetic thin films of Examples 1 and 2 is particularly preferably in the temperature range of 480° C. or higher and 510° C. or lower.

(Studies about Reason for Increase in Coercive Force Hc by Annealing)

A high coercive force Hc of 10.8 kOe was obtained by annealing the magnetic thin film of Example 1 at 500° C. To study the reason for obtaining a high coercive force Hc by annealing, the magnetocrystalline anisotropy constant $K_u^{grain}$ and the anisotropic magnetic field $H_k^{grain}$ of the CoPt alloy magnetic crystal grains in the magnetic thin film of Example 1 were calculated. Specifically, the magnetocrystalline anisotropy constant $K_u^{grain}$ and the anisotropic magnetic field $H_k^{grain}$ were calculated by subtracting the amount corresponding to the effect of 30 vol % of $WO_3$ from the average magnetic property values of the CoPt—$WO_3$ magnetic thin film.

The magnetocrystalline anisotropy constant $K_u^{grain}$ and the anisotropic magnetic field $H_k^{grain}$ have a relationship of $K_u^{grain} = (M_s^{grain} \times H_k^{grain})^2$, wherein $M_s^{grain}$ is the saturation magnetization of each crystal grain and is calculated from the average saturation magnetization determined with a vibrating sample magnetometer. The saturation magnetization $M_s^{grain}$ of each crystal grain was substantially constant at about 990 emu/cm³ regardless of whether annealing was performed and the annealing temperature.

Figure 8:
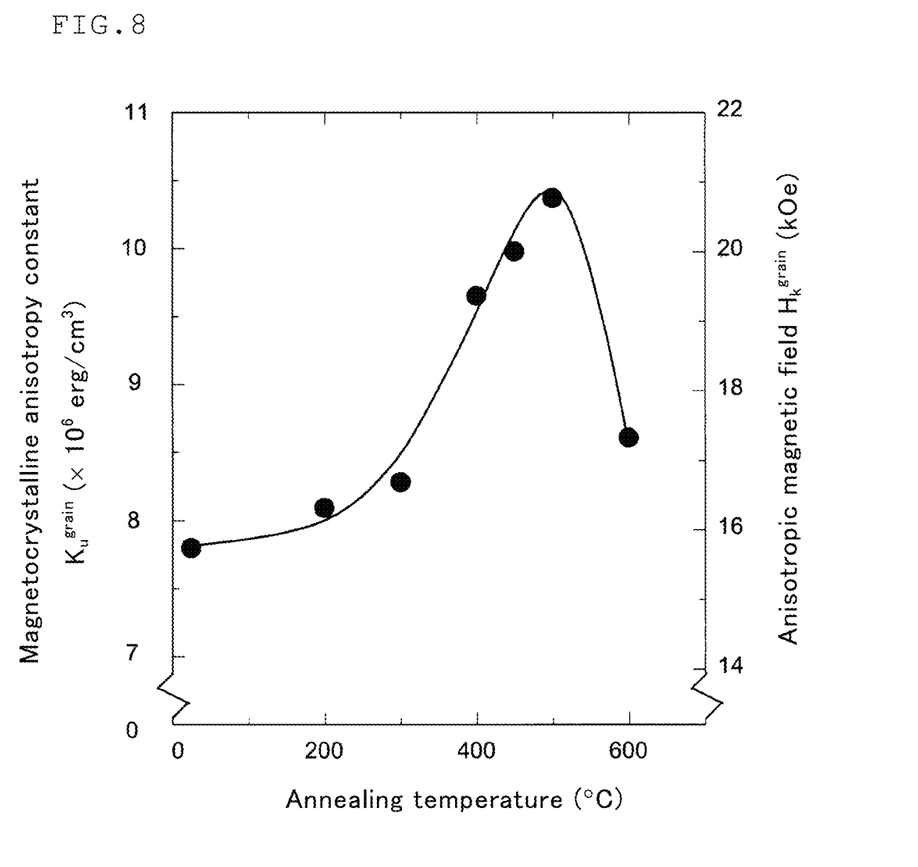
FIG. 8 is a figure illustrating, as a graph, the magnetocrystalline anisotropy constant $K_u^{grain}$ and the anisotropic magnetic field $H_k^{grain}$ calculated for the CoPt alloy magnetic crystal grains in the magnetic thin film of Example 1.

FIG. 8 is a figure illustrating, as a graph, the magnetocrystalline anisotropy constant $K_u^{grain}$ and the anisotropic magnetic field $H_k^{grain}$ calculated for the CoPt alloy magnetic crystal grains in the magnetic thin film of Example 1. In the graph shown in FIG. 8, the horizontal axis represents the annealing temperature (° C.), and the vertical axis represents the magnetocrystalline anisotropy constant $K_u^{grain}$ ($\times 10^6$ erg/cm³) and the anisotropic magnetic field $H_k^{grain}$ (kOe).

As can be seen from FIG. 8, when the annealing temperature increases from room temperature to 500° C., the magnetocrystalline anisotropy constant $K_u^{grain}$ increases from $7.8 \times 10^6$ erg/cm³ to $10.4 \times 10^6$ erg/cm³, and the anisotropic magnetic field $H_k^{grain}$ increases from 15.7 kOe to 21 kOe. Since the ways the magnetocrystalline anisotropy constant $K_u^{grain}$ and the anisotropic magnetic field $H_k^{grain}$ change are the same as the way the coercive force Hc changes shown in FIG. 5, an increase in coercive force Hc by annealing is supposed to be on the basis of an increase in magnetocrystalline anisotropy constant $K_u^{grain}$.

(Additional Studies about Composition of CoPt Alloy)

The results of Reference Instance, Examples 1 and 2, and Comparative Examples 1 and 2 as described above reveal that a magnetic thin film having a coercive force Hc over 10 kOe is obtained by annealing, at 500° C., a magnetic thin film formed by using the sputtering target that contains Co, Pt, and an oxide, does not contain Cr, and has $WO_3$ as the oxide without heating the substrate.

However, the chemical composition of Co and Pt in the sputtering targets used in Examples 1 and 2 and Comparative Examples 1 and 2 is 80Co-20Pt, only one type of composition.

Then, magnetic thin films formed by using sputtering targets having different compositions of Co and Pt (and containing 30 vol % of $WO_3$ as an oxide) without heating the substrate were annealed at 500° C. The coercive force Hc and the nucleation magnetic field Hn of the annealed magnetic thin films were determined to study the range of the composition of Co and Pt in the sputtering target that exhibits advantageous effects of the present invention.

The compositions of Co and Pt in the sputtering targets in additional studies (Examples 3 to 7, Comparative Examples 3 and 4) were 90Co-10Pt in Example 3, 85Co-15Pt in Example 4, 50Co-50Pt in Example 5, 25Co-75Pt in Example 6, and 20Co-80Pt in Example 7. The metallic component in the sputtering target of Comparative Example 3 is only Co, and the metallic component in the sputtering target of Comparative Example 4 is only Pt. The targets were prepared in the same manner as in Example 1 except that the composition of Co and Pt was changed. The coercive force Hc and the nucleation magnetic field Hn of the magnetic thin films were determined in the same manner as in Example 1. The measured results are shown in Table 2 below together with the measured results of Example 1.

TABLE 2

|  | Compositions of CoPt | $WO_3$ content (vol %) | Coercive force Hc (kOe) | Nucleation magnetic field Hn (kOe) |
|---|---|---|---|---|
| Comparative Example 3 | 100Co | 30 | 0.5 | 0.0 |
| Example 3 | 90Co—10Pt | 30 | 7.8 | 3.5 |
| Example 4 | 85Co—15Pt | 30 | 9.5 | 4.6 |
| Example 1 | 80Co—20Pt | 30 | 10.8 | 5.5 |
| Example 5 | 50Co—50Pt | 30 | 13.3 | 6.7 |
| Example 6 | 25Co—75Pt | 30 | 11.1 | 5.2 |
| Example 7 | 20Co—80Pt | 30 | 6.8 | 2.3 |
| Comparative Example 4 | 100Pt | 30 | 0.0 | 0.0 |

As can be seen from Table 2, the coercive forces Hc, after annealing at 500° C., of the magnetic thin films formed by using the sputtering targets within the scope of the present invention (Example 1, Examples 3 to 7) were all 6.8 kOe or higher, which were equal to or higher than the current technical level of coercive force. In particular, the coercive forces Hc of the magnetic thin films of Examples 1, 5 and 6 were 10 kOe or higher, which were significantly high coercive forces.

The coercive forces Hc, after annealing at 500° C., of the magnetic thin films formed by using the sputtering target of Comparative Example 3 out of the scope of the present invention in which the metallic component was only Co and the sputtering target of Comparative Example 4 out of the scope of the present invention in which the metallic component was only Pt were as small as 0.5 kOe and 0.0 kOe, respectively.

(Additional Studies about Oxide Content)

As described above, the coercive forces Hc, after annealing at 500° C., of the magnetic thin films formed by using the sputtering targets within the scope of the present invention (Example 1, Examples 3 to 7) were all 6.8 kOe or higher, which were coercive forces equal to or higher than the current technical level of coercive force and showed favorable results.

However, the $WO_3$ content in the sputtering targets used in Example 1 and Examples 3 to 7 was 30 vol %, only one type of content.

Then, magnetic thin films formed by using sputtering targets (the composition of Co and Pt was 80Co-20Pt) having different $WO_3$ contents without heating the substrate were annealed at 500° C. The coercive force Hc and the nucleation magnetic field Hn of the annealed magnetic thin films were determined to study the range of the $WO_3$ content in the sputtering target that exhibits advantageous effects of the present invention.

The $WO_3$ contents in the sputtering targets in additional studies (Examples 8 to 13, Comparative Example 5) were 10 vol % in Example 8, 20 vol % in Example 9, 25 vol % in Example 10, 35 vol % in Example 11, 40 vol % in Example 12, 50 vol % in Example 13, and 0 vol % in Comparative Example 5. The targets were prepared in the same manner as in Example 1 except that the $WO_3$ content was changed. The coercive force Hc and the nucleation magnetic field Hn of the magnetic thin films were determined in the same manner as in Example 1. The measured results are shown in Table 3 below together with the measured results of Example 1.

TABLE 3

| | Compositions of CoPt | $WO_3$ content (vol %) | Coercive force Hc (kOe) | Nucleation magnetic field Hn (kOe) |
|---|---|---|---|---|
| Example 8 | 80Co—20Pt | 10 | 7.5 | 3.2 |
| Example 9 | 80Co—20Pt | 20 | 9.5 | 4.3 |
| Example 10 | 80Co—20Pt | 25 | 10.4 | 5.0 |
| Example 1 | 80Co—20Pt | 30 | 10.8 | 5.5 |
| Example 11 | 80Co—20Pt | 35 | 10.8 | 5.5 |
| Example 12 | 80Co—20Pt | 40 | 10.0 | 4.7 |
| Example 13 | 80Co—20Pt | 50 | 6.9 | 2.9 |
| Comparative Examples 5 | 80Co—20Pt | 0 | 0.7 | −1.9 |

As can be seen from Table 3, the coercive forces Hc, after annealing at 500° C., of the magnetic thin films formed by using the sputtering targets within the scope of the present invention (Example 1, Examples 8 to 13) were all 6.9 kOe or higher, which were equal to or higher than the current technical level of coercive force. In particular, the coercive forces Hc of the magnetic thin films of Examples 1, 10, 11 and 12 were 10 kOe or higher, which were significantly high coercive forces.

The coercive force Hc, after annealing at 500° C., of the magnetic thin film formed by using the sputtering target of Comparative Example 5 out of the scope of the present invention in which the $WO_3$ content was 0 was as small as 0.7 kOe.

The invention claimed is:

1. A sputtering target comprising metallic Co, metallic Pt, and an oxide,
    wherein the sputtering target does not contain metallic Cr, and
    the oxide is $WO_3$, and
    wherein the sputtering target comprises 25 to 50 at % of metallic Co relative to a total of metallic Co and metallic Pt.

2. The sputtering target according to claim 1, wherein the sputtering target comprises 50 at % of metallic Co relative to a total of metallic Co and metallic Pt.

3. The sputtering target according to claim 1, wherein a magnetic thin film formed by using the sputtering target is allowed to have a coercive force of 11 kOe or higher by annealing the magnetic thin film at 500° C.

4. The sputtering target according to claim 2, wherein a magnetic thin film formed by using the sputtering target is allowed to have a coercive force of 13 kOe or higher by annealing the magnetic thin film at 500° C.

5. The sputtering target according to claim 1, wherein the sputtering target comprises 10 to 50 vol % of the oxide.

6. The sputtering target according to claim 1, wherein the sputtering target comprises 25 to 35 vol % of the oxide.

7. The sputtering target according to claim 3, wherein the magnetic thin film after the annealing has a granular structure.

8. A process for production of a sputtering target, comprising:
    a step of preparing a CoPt alloy powder that contains Co and Pt and does not contain Cr by an atomizing method;
    a step of preparing a powder mixture for pressure sintering by dispersedly mixing an oxide powder and the prepared CoPt alloy powder; and
    a step of pressure-sintering the prepared powder mixture for pressure sintering,
    wherein the oxide powder is $WO_3$, and
    wherein the obtained sputtering target comprises 25 to 50 at % of metallic Co relative to a total of metallic Co and metallic Pt.

9. A process for production of a sputtering target, comprising:
    a step of obtaining a powder mixture for pressure sintering by dispersedly mixing a Co powder, a Pt powder, and an oxide powder; and
    a step of pressure-sintering the obtained powder mixture for pressure sintering,
    wherein the oxide powder is $WO_3$, and
    wherein the obtained sputtering target comprises 25 to 50 at % of metallic Co relative to a total of metallic Co and metallic Pt.

10. The process for production of a sputtering target according to claim 8, wherein the obtained sputtering target contains 50 at % of metallic Co relative to a total of the metallic Co and metallic Pt.

11. The process for production of a sputtering target according to claim 8, wherein a volume fraction of the oxide powder in the entire powder mixture for pressure sintering is 10 to 50 vol %.

12. The process for production of a sputtering target according to claim 8, wherein a volume fraction of the oxide powder in the entire powder mixture for pressure sintering is 25 to 35 vol %.

13. The sputtering target according to claim 4, wherein the magnetic thin film after the annealing has a granular structure.

14. The sputtering target according to claim 2, wherein the sputtering target comprises 10 to 50 vol % of the oxide.

15. The sputtering target according to claim 2, wherein the sputtering target comprises 25 to 35 vol % of the oxide.

16. The sputtering target according to claim 1, wherein the sputtering target comprises 30 vol % of the oxide.

17. The sputtering target according to claim 2, wherein the sputtering target comprises 30 vol % of the oxide.

18. The process for production of a sputtering target according to claim 9, wherein the obtained sputtering target contains 50 at % of metallic Co relative to a total of the metallic Co and metallic Pt.

19. The process for production of a sputtering target according to claim 9, wherein a volume fraction of the oxide powder in the entire powder mixture for pressure sintering is 10 to 50 vol %.

20. The process for production of a sputtering target according to claim 9, wherein a volume fraction of the oxide powder in the entire powder mixture for pressure sintering is 25 to 35 vol %.

* * * * *